(12) United States Patent
McElfresh et al.

(10) Patent No.: US 8,140,282 B2
(45) Date of Patent: Mar. 20, 2012

(54) DETERMINING A TOTAL LENGTH FOR CONDUCTIVE WHISKERS IN COMPUTER SYSTEMS

(75) Inventors: David K. McElfresh, San Diego, CA (US); Kenny C. Gross, San Diego, CA (US); Ramakrishna C. Dhanekula, San Diego, CA (US)

(73) Assignee: Oracle America, Inc., Redwood Shores, CA (US)

( * ) Notice: Subject to any disclaimer, the term of this patent is extended or adjusted under 35 U.S.C. 154(b) by 813 days.

(21) Appl. No.: 12/126,612

(22) Filed: May 23, 2008

(65) Prior Publication Data
US 2009/0292490 A1    Nov. 26, 2009

(51) Int. Cl.
*G01R 13/00*    (2006.01)
(52) U.S. Cl. .......................................... 702/66
(58) Field of Classification Search .............. 702/66, 702/58; 117/205; 439/492
See application file for complete search history.

(56) References Cited

U.S. PATENT DOCUMENTS

| | | | |
|---|---|---|---|
| 6,451,113 B1* | 9/2002 | Givargizov | 117/205 |
| 7,188,037 B2* | 3/2007 | Hidehira | 702/58 |
| 2007/0026724 A1* | 2/2007 | Mori et al. | 439/492 |

OTHER PUBLICATIONS

Alexey A. Petrov (http://www.physics.wayne.edu/~apetrov/PHY2140/) "General Physics (PHY 2140), Lecture 22: Electricity and Magnetism, Electromagnetic waves", Oct. 27, 2003, Wayne State University.*
Matarrese et al., "Improved Coupling to Infrared Whisker Diodes by Use of Antenna Theory", Applied Physics Letters, vol. 17, No. 1, Jul. 1970.*
Bolomey et al., "On the electromagnetic effective length of whisker structures for IR diodes at 10.6 microns", International Journal of Infrared and Millimeter Waves, vol. 2, May 1981, p. 541-558.*

* cited by examiner

*Primary Examiner* — Jonathan C Teixeira Moffat
*Assistant Examiner* — Xiuquin Sun
(74) *Attorney, Agent, or Firm* — Park, Vaughan, Fleming & Dowler LLP

(57) ABSTRACT

One embodiment of the present invention provides a system that determines a total whisker length for conductive whiskers on a circuit in a computer system. During operation, a target electromagnetic signal radiating from the computer system is monitored. Then, the target electromagnetic signal is analyzed to determine the total whisker length for conductive whiskers on the circuit in the computer system.

20 Claims, 9 Drawing Sheets

DETERMINING A TOTAL LENGTH FOR CONDUCTIVE WHISKERS IN COMPUTER SYSTEMS

BACKGROUND

1. Field

The present invention generally relates to techniques for fault-monitoring in computer systems. More specifically, the present invention relates to a method and an apparatus that determines a total whisker length for conductive whiskers on a circuit in a computer system.

2. Related Art

In an effort to reduce hazardous waste from electronic products, the lead content of plating used on circuits in some computer systems has been reduced or eliminated. Typically, pure tin or a high tin alloy is used instead. However, a disadvantage of these new plating materials is the growth of needle-like conductive tin crystals from tin-finished surfaces. These needle-like structures are commonly referred to as "whiskers." When whiskers on a circuit grow to a critical length, there is an increased chance that they can cause electrical shorting between adjacent leads of a component, between leads of adjacent components on a circuit board, or between leads of a component and the traces on the circuit board, leading to damage or failure of the affected circuit. If a computer system administrator could be warned in advance that the total whisker length is approaching a critical length, the administrator may be able to take preventative measures such as swapping the affected circuit board(s), switching applications to a redundant computer system, or performing a service action to clean the whiskers.

Hence, what is needed is a method and system that determines a total whisker length for conductive whiskers on a circuit in a computer system without the above-described problems.

SUMMARY

Some embodiments of the present invention provide a system that determines a total whisker length for conductive whiskers on a circuit in a computer system. First, a target electromagnetic signal radiating from the computer system is monitored. Then, the target electromagnetic signal is analyzed to determine the total whisker length for conductive whiskers on the circuit in the computer system.

In some embodiments, prior to monitoring the target electromagnetic signal, a reference electromagnetic signal radiating from the computer system is monitored. Then, a reference electromagnetic-signal fingerprint is generated from the reference electromagnetic signal, and a pattern-recognition model is built based on the reference electromagnetic-signal fingerprint.

In some embodiments, the pattern-recognition model includes a nonlinear, nonparametric (NLNP) regression model.

In some embodiments, analyzing the target electromagnetic signal includes first generating a target electromagnetic-signal fingerprint from the target electromagnetic signal. Then, the target electromagnetic-signal fingerprint is fed into the pattern-recognition model, and an estimated electromagnetic-signal fingerprint is produced using the pattern recognition model. Next, the target electromagnetic-signal fingerprint is compared to the estimated electromagnetic fingerprint to determine the total whisker length.

In some embodiments, generating the reference electromagnetic-signal fingerprint includes first generating a frequency-domain representation of the reference electromagnetic signal. Next, a set of frequencies is selected from the frequency-domain representation of the reference electromagnetic signal. Then, the reference electromagnetic-signal fingerprint is formed using the set of frequencies.

In some embodiments, selecting the set of frequencies includes dividing the frequency-domain representation of the reference electromagnetic signal into a plurality of frequencies. Then, a reference electromagnetic-signal amplitude-time series is constructed for each of the plurality of frequencies based on the reference electromagnetic signal collected over a predetermined time period. Next, cross-correlations are computed between pairs of reference electromagnetic-signal amplitude-time series associated with pairs of the plurality of frequencies. Then, the set of frequencies is selected based on the average correlation coefficients.

In some embodiments, the reference electromagnetic signal is collected from the computer system while the computer system is executing a load script, wherein the load script includes a specified sequence of operations.

In some embodiments, the load script includes a dynamic load script.

In some embodiments, building the pattern-recognition model based on the reference electromagnetic-signal fingerprint includes training the pattern-recognition model using the reference electromagnetic-signal amplitude-time series associated with the set of frequencies as inputs to the pattern-recognition model.

In some embodiments, generating the target electromagnetic-signal fingerprint includes transforming the target electromagnetic signal to a frequency-domain representation, and for each frequency in the set of frequencies, generating a target electromagnetic-signal amplitude-time series based on the frequency-domain representation of the target electromagnetic signal collected over time. Then, the target electromagnetic-signal fingerprint is formed using the target electromagnetic-signal amplitude-time series associated with the set of frequencies.

In some embodiments, comparing the target electromagnetic-signal fingerprint to the estimated electromagnetic fingerprint includes, for each frequency in the set of frequencies, first computing a residual signal between a corresponding monitored electromagnetic-signal amplitude-time series in the target electromagnetic-signal fingerprint and a corresponding estimated electromagnetic-signal amplitude-time series in the estimated electromagnetic-signal fingerprint. Then, anomalies in the residual signal are detected by using sequential detection, wherein the anomalies indicate a deviation of the monitored electromagnetic-signal amplitude-time series from the estimated electromagnetic-signal amplitude-time series.

In some embodiments, determining the total whisker length includes monitoring a change in the detection of anomalies in one or more of the monitored electromagnetic-signal amplitude-time series over time.

In some embodiments, the sequential detection includes a sequential probability ratio test.

In some embodiments, determining the total whisker length includes measuring a rate of the detection of anomalies for a predetermined total whisker length.

Some embodiments further include monitoring a reference electromagnetic signal, wherein the total whisker length is known when the reference electromagnetic signal is monitored, and wherein analyzing the target electromagnetic signal to determine the total whisker length includes comparing a derived target electromagnetic signal to a derived reference electromagnetic signal wherein the derived target electromagnetic signal is generated using information from the target electromagnetic signal and the derived reference electromagnetic signal is generated using information from the reference electromagnetic signal.

In some embodiments, the total whisker length is known when the reference electromagnetic signal is monitored.

DETAILED DESCRIPTION

The following description is presented to enable any person skilled in the art to make and use the disclosed embodiments, and is provided in the context of a particular application and its requirements. Various modifications to the disclosed embodiments will be readily apparent to those skilled in the art, and the general principles defined herein may be applied to other embodiments and applications without departing from the spirit and scope of the present description. Thus, the present description is not intended to be limited to the embodiments shown, but is to be accorded the widest scope consistent with the principles and features disclosed herein.

The data structures and code described in this detailed description are typically stored on a computer-readable storage medium, which may be any device or medium that can store code and/or data for use by a computer system. This includes, but is not limited to, volatile memory, non-volatile memory, magnetic and optical storage devices such as disk drives, magnetic tape, CDs (compact discs), DVDs (digital versatile discs or digital video discs), or other media capable of storing computer-readable media now known or later developed.

Figure 1:
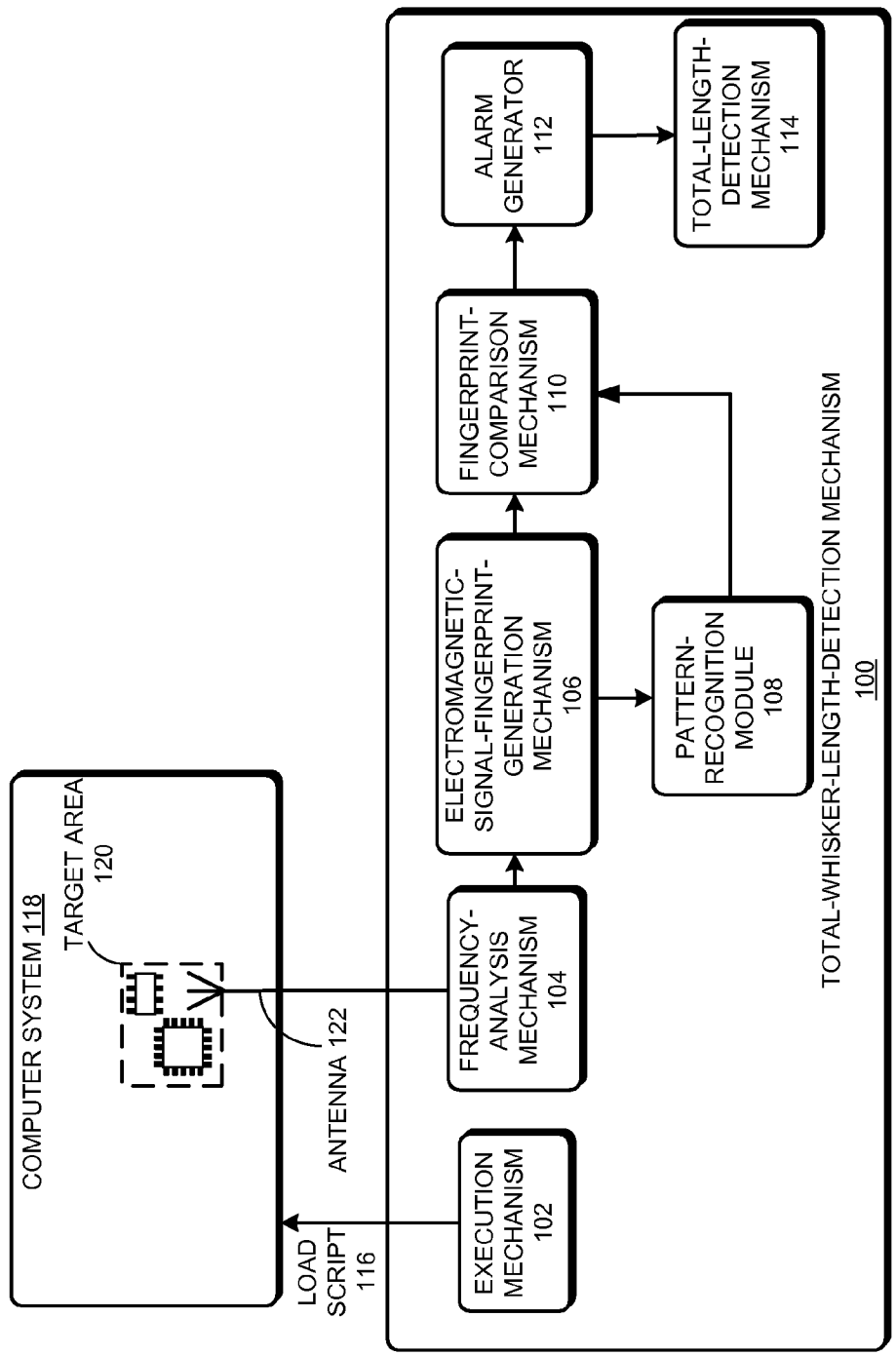
FIG. 1 illustrates a system that determines a total whisker length for conductive whiskers on a circuit in a computer system in accordance with some embodiments of the present invention.

FIG. 1 illustrates a system that determines a total whisker length for conductive whiskers on a circuit in a computer system in accordance with some embodiments of the present invention. As illustrated in FIG. 1, total-whisker-length-detection mechanism 100 includes: execution mechanism 102, frequency-analysis mechanism 104, electromagnetic-signal-fingerprint-generation mechanism 106, pattern-recognition module 108, fingerprint-comparison mechanism 110, alarm generator 112, and total-length-detection mechanism 114.

In some embodiments of the present invention, execution mechanism 102 causes load script 116 to be executed by computer system 118 during a total-whisker-length detection process. Note that the total-whisker-length detection process can be performed in parallel with normal computer system operation. In some embodiments of the present invention, execution mechanism 102 is only used during the training phase of the total-whisker-length detection process. Hence, execution mechanism 102 is idle during the monitoring phase of the total-whisker-length detection process. In other embodiments, execution mechanism 102 causes load script 116 to be executed by computer system 118 during the training phase. Then, during the total-whisker-length detection process, normal computer system operation is interrupted and execution mechanism 102 causes load script 116 to be executed by computer system 118. In some embodiments of the present invention, load script 116 is stored on computer system 118.

In some embodiments of the present invention, load script 116 can include: a sequence of instructions that produces a load profile that oscillates between specified CPU utilization percentages for a CPU in computer system 118; and/or a sequence of instructions that produces a customized load profile. In some embodiments of the present invention, the load script is a dynamic load script which changes the load on the CPU as a function of time.

In some embodiments of the present invention, during the total-whisker-length detection process, the electromagnetic signal generated within one or more circuits in target area 120 is collected by antenna 122 which is coupled to frequency-analysis mechanism 104. It is noted that the electromagnetic signal can be comprised of a set of one or more electromagnetic signals.

The target electromagnetic signal is received by frequency-analysis mechanism 104, which then transforms the collected electromagnetic signal time-series to the frequency-domain. In some embodiments of the present invention, the received target electromagnetic signal is amplified prior to being transformed into frequency domain. In some embodiments of the present invention, frequency-analysis mechanism 104 can include a spectrum analyzer.

Frequency-analysis mechanism 104 is coupled to electromagnetic-signal-fingerprint-generation mechanism 106. In some embodiments of the present invention, electromagnetic-signal-fingerprint-generation mechanism 106 is configured to generate an electromagnetic-signal fingerprint based on the frequency-domain representation of the electromagnetic signal. This process is described in more detail below in conjunction with FIG. 3.

As illustrated in FIG. 1, the output of electromagnetic-signal-fingerprint-generation mechanism 106 is coupled to the inputs of both pattern-recognition module 108 and fingerprint-comparison mechanism 110. In some embodiments of the present invention, pattern-recognition module 108 performs at least two functions. First, pattern-recognition module 108 can build a pattern-recognition model for estimating the electromagnetic-signal fingerprint associated with the electromagnetic signal received from target area 120. Second, pattern-recognition module 108 can use the above pattern-recognition model to compute estimates of the electromagnetic-signal fingerprint associated with the electromagnetic-signal received from target area 120. This operation of pattern-recognition module 108 is described in more detail below in conjunction with FIGS. 5 and 6.

Fingerprint-comparison mechanism 110 compares the electromagnetic-signal fingerprint generated by electromagnetic-signal-fingerprint-generation mechanism 106 to an estimated electromagnetic-signal fingerprint computed by the pattern-recognition model. The comparison operation performed by fingerprint-comparison mechanism 110 is described in more detail below in conjunction with FIG. 6. Alarm generator 112 is configured to generate an alarm based on the comparison results from fingerprint-comparison mechanism 110. Finally, total-length-detection mechanism 114 is configured to determine a total whisker length based on a change in the rate of alarms from alarm generator 112 over time.

Figure 2:
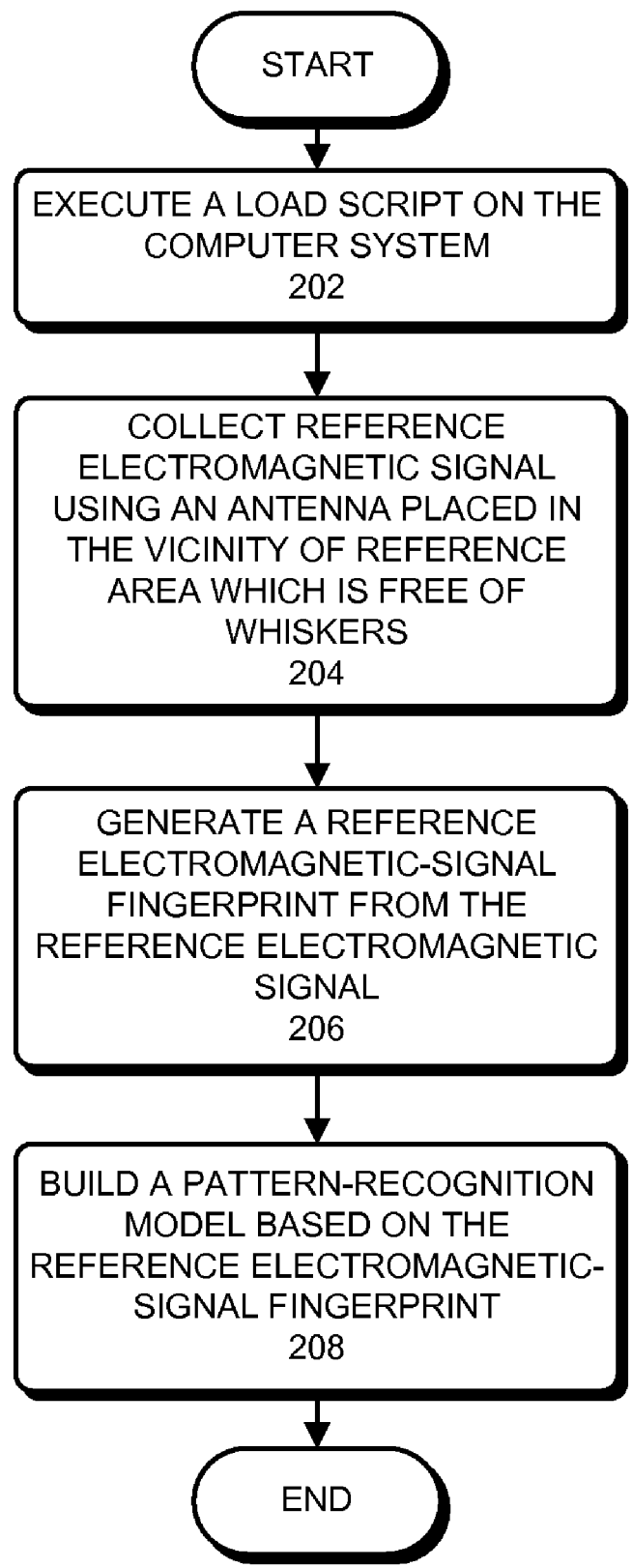
FIG. 2 presents a flowchart illustrating the process of building the pattern recognition model in accordance with some embodiments of the present invention.

In some embodiments of the present invention, prior to determining a total whisker length, the total-whisker-length-detection mechanism builds a pattern-recognition model based on an electromagnetic signal collected from an area known to be free of any conductive whiskers. FIG. 2 presents a flowchart illustrating the process of building the pattern-recognition model in accordance with some embodiments of the present invention.

During operation, the total-whisker-length-detection mechanism executes a load script the computer system, wherein the load script includes a specified sequence of operations (step 202). In some embodiments of the present invention, the load script is a dynamic load script which changes the load on a CPU in the computer system as a function of time. While executing the load script, the total-whisker-length-detection mechanism collects a reference electromagnetic signal time-series using an antenna placed in the vicinity of a reference area within the computer system which is determined to be free of whiskers (step 204). In some embodiments of the present invention, the reference area is the target area when the target area is determined to be free of whiskers. For example, the reference electromagnetic signal can be collected when the computer system is first deployed in the field. In another embodiment, the reference electromagnetic signal can be collected from the reference area after the reference area has been visually inspected and determined to be free of whiskers.

Next, the system generates a reference electromagnetic-signal fingerprint from the reference electromagnetic signal (step 206). We describe the process of generating the reference electromagnetic-signal fingerprint below in conjunction with FIG. 3. The system next builds the pattern-recognition model based on the reference electromagnetic-signal fingerprint (step 208). Note that step 208 can be performed by pattern-recognition module 108 in FIG. 1. We describe step 208 further below after we provide more details of generating the reference electromagnetic-signal fingerprint.

Figure 3:
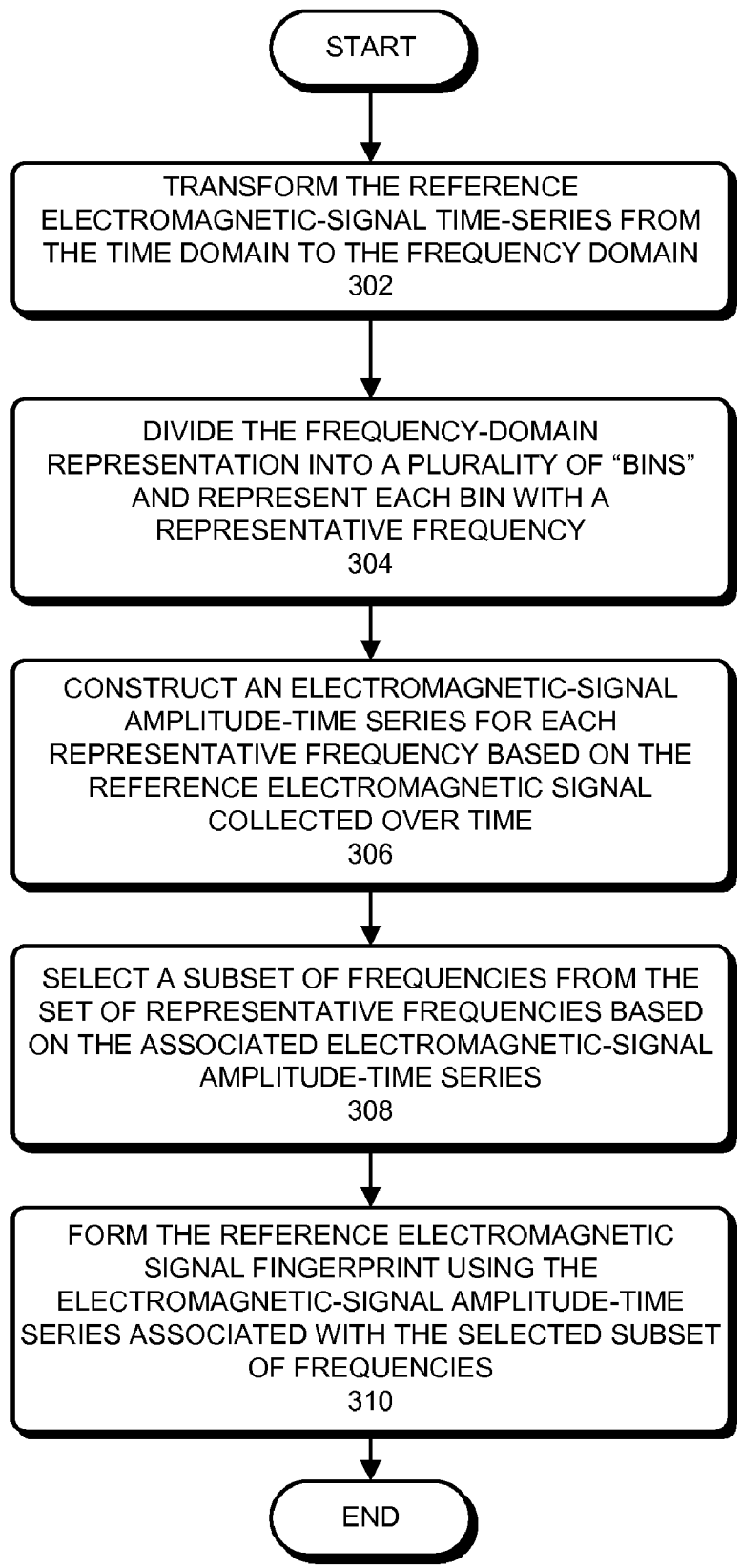
FIG. 3 presents a flowchart illustrating the process of generating the reference electromagnetic-signal fingerprint from the reference electromagnetic signal in accordance with some embodiments of the present invention.

FIG. 3 presents a flowchart illustrating the process of generating the reference electromagnetic-signal fingerprint from the reference electromagnetic signal in accordance with some embodiments of the present invention.

During operation, the system starts by transforming the electromagnetic-signal time series from the time domain to the frequency domain (step 302). In some embodiments of the present invention, transforming the electromagnetic-signal time series from the time domain to the frequency domain involves using a fast Fourier transform (FFT). In other embodiments, other transform functions can be used, including, but not limited to, a Laplace transform, a discrete Fourier transform, a Z-transform, and any other transform technique now known or later developed.

The system then divides the frequency range associated with the frequency-domain representation of the reference electromagnetic signal into a plurality of "bins," and represents each discrete bin with a representative frequency (step 304). For example, one can divide the frequency range into about 600 bins. In some embodiments, these frequency bins and the associated frequencies are equally spaced.

Next, for each of the plurality of representative frequencies, the system constructs an electromagnetic-signal amplitude-time series based on the reference electromagnetic-signal time series collected over a predetermined time period (step 306). In some embodiments, to generate the time series for each frequency, the electromagnetic signal is sampled at predetermined time intervals, for example once every second or every minute. Next, each of the sampled electromagnetic signal intervals is transformed into the frequency domain, and an electromagnetic-signal amplitude-time pair is subsequently extracted for each of the representative frequencies at each time interval. In this way, the system generates a large number of separate electromagnetic-signal amplitude-time series for the plurality of frequencies.

The system next selects a subset of frequencies from the plurality of frequencies based on the associated electromagnetic-signal amplitude-time series (step 308). It is noted that in some embodiments, a subset of frequencies is not selected and the system uses all of the available frequencies. In some embodiments, selecting the subset of frequencies optimizes detection sensitivity while minimizing computation costs.

Figure 4:
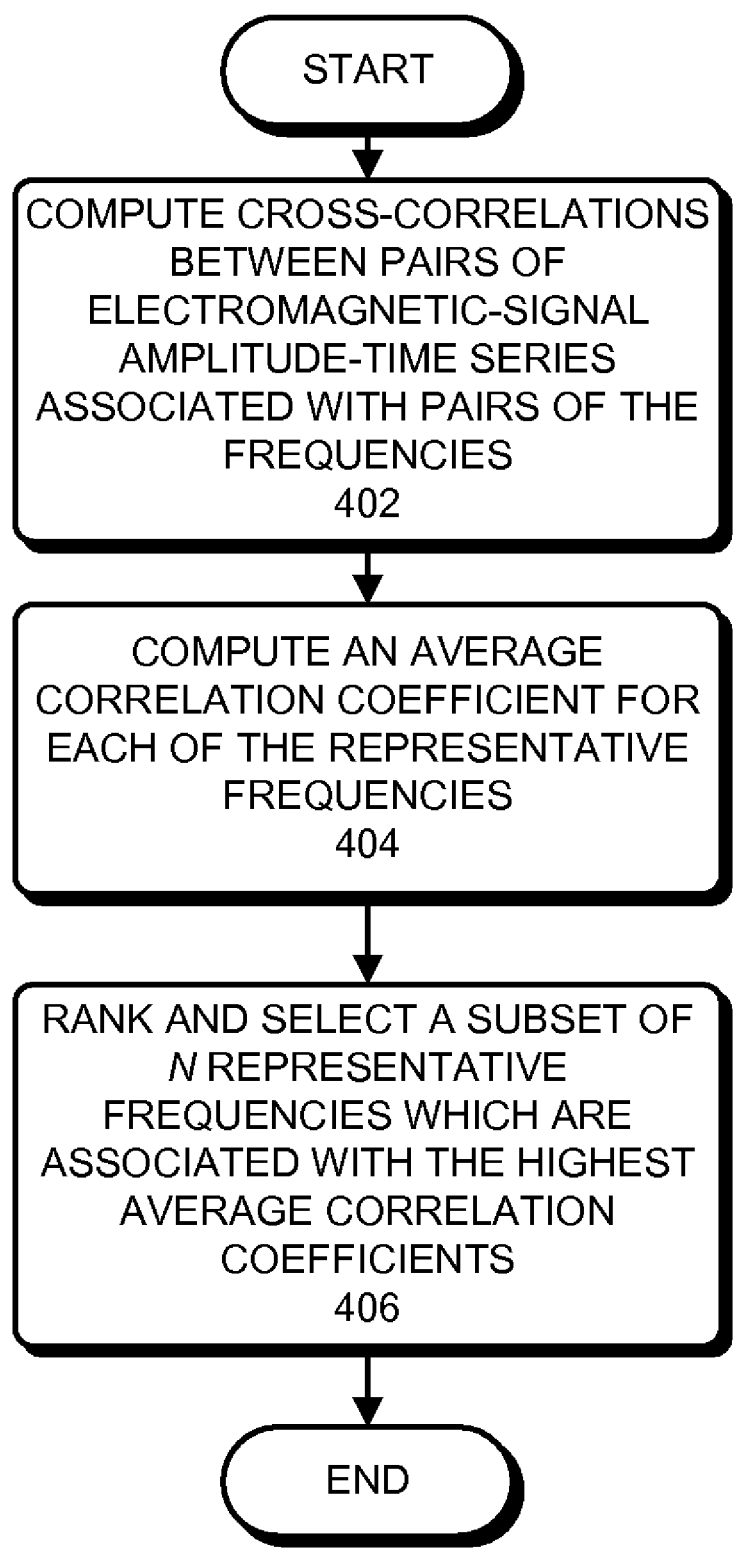
FIG. 4 presents a flowchart illustrating the process of selecting the subset of frequencies based on the correlations between the set of electromagnetic-signal amplitude-time series in accordance with some embodiments of the present invention.

FIG. 4 presents a flowchart illustrating the process of selecting the subset of frequencies based on the correlations between the set of electromagnetic-signal amplitude-time series in accordance with some embodiments of the present invention. During operation, the system computes cross-correlations between pairs of electromagnetic-signal amplitude-time series associated with pairs of the representative frequencies (step 402). Next, the system computes an average correlation coefficient for each of the plurality of representative frequencies (step 404). The system then ranks and selects a subset of N representative frequencies which are associated with the highest average correlation coefficients (step 406). Note that the electromagnetic-signal amplitude-time series associated with these N frequencies are the most highly correlated with other amplitude-time series. In some embodiments of the present invention, N is typically less than or equal to 20.

Referring back to FIG. 3, when the subset of frequencies has been selected, the system forms the reference electromagnetic-signal fingerprint using the electromagnetic-signal amplitude-time series associated with the selected frequencies (step 310).

Referring back to step 208 in FIG. 2, note that when the reference electromagnetic-signal fingerprint is generated, the system uses the set of N electromagnetic-signal amplitude-time series associated with the selected frequencies as training data to train the pattern-recognition model. In some embodiments of the present invention, the pattern-recognition model is a non-linear, non-parametric (NLNP) regression model. In some embodiments of the present invention, the NLNP regression model is used during a multivariate state estimation technique (MSET). During this model training process, an NLNP regression model receives the set of electromagnetic-signal amplitude-time series (i.e., the reference electromagnetic-signal fingerprint) as inputs (i.e., training data), and learns the patterns of interaction between the set of N electromagnetic-signal amplitude-time series. Consequently, when the training is complete, the NLNP regression model is configured and ready to perform model estimates for the same set of N electromagnetic-signal amplitude-time series.

Figure 5:
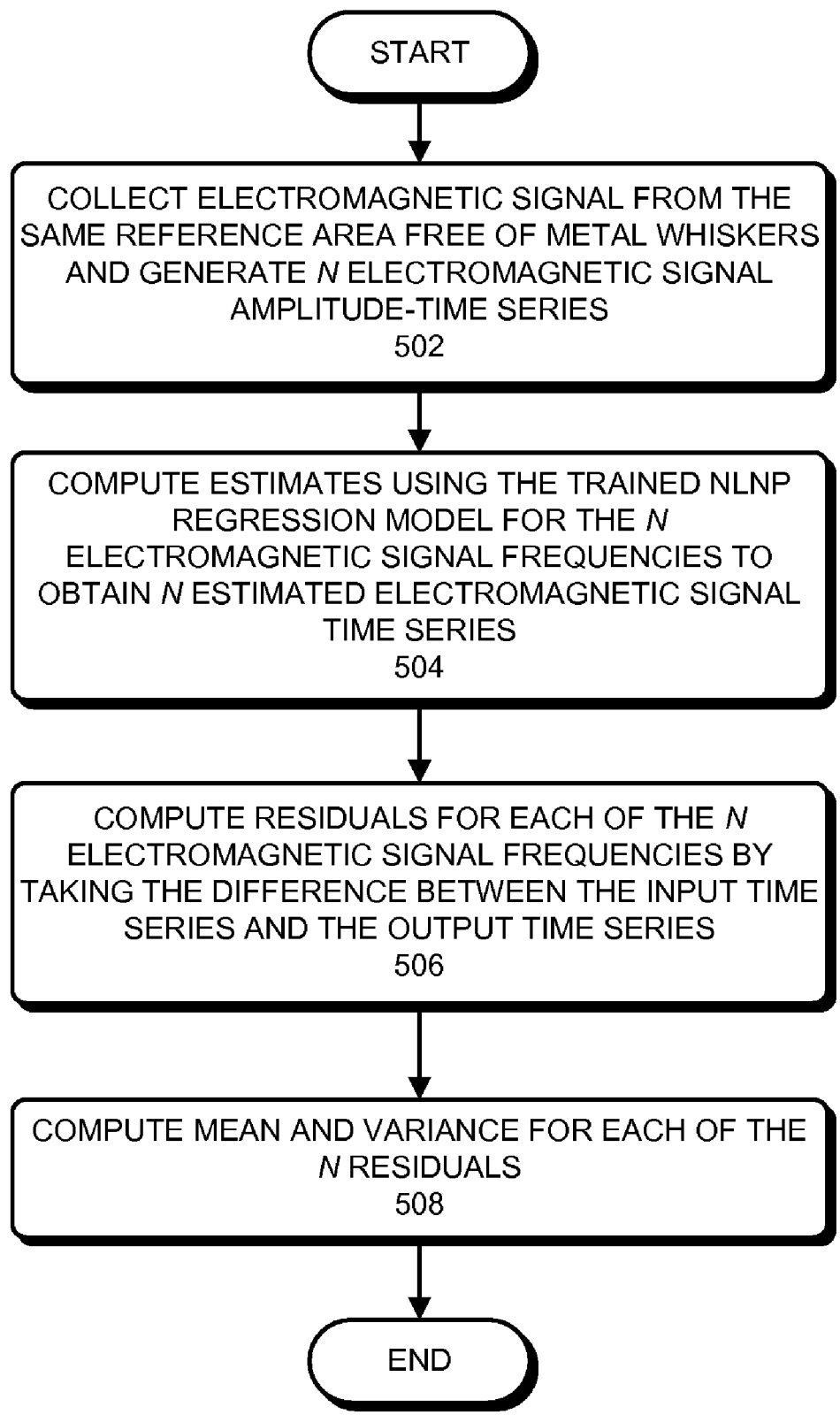
FIG. 5 presents a flowchart illustrating the process of computing mean and variance of residuals for the model estimates in accordance with some embodiments of the present invention.

In some embodiments of the present invention, when the NLNP regression model is built, it is subsequently used to compute mean and variance of residuals associated with the model estimates. Note that these mean and variance values will be used during the monitoring process as described below. Specifically, FIG. 5 presents a flowchart illustrating the process of computing mean and variance of residuals for the model estimates in accordance with some embodiments of the present invention.

During operation, the system collects an electromagnetic signal from the same reference area within the computer system which is free of whiskers and generates the same set of N electromagnetic-signal amplitude-time series in a process as described above (step 502). The system then computes estimates using the trained NLNP regression model for the set of N electromagnetic signal frequencies (step 504). Specifically, the NLNP regression model receives the set of N electromagnetic-signal amplitude-time series as inputs and produces a corresponding set of N estimated electromagnetic-signal amplitude-time series as outputs. Next, the system computes the residuals for each of the N electromagnetic signal frequencies by taking the difference between the corresponding input time series and the output time series (step 506). Hence, the system obtains N residuals. The system then computes mean and variance for each of the N residuals (step 508).

Figure 6A:
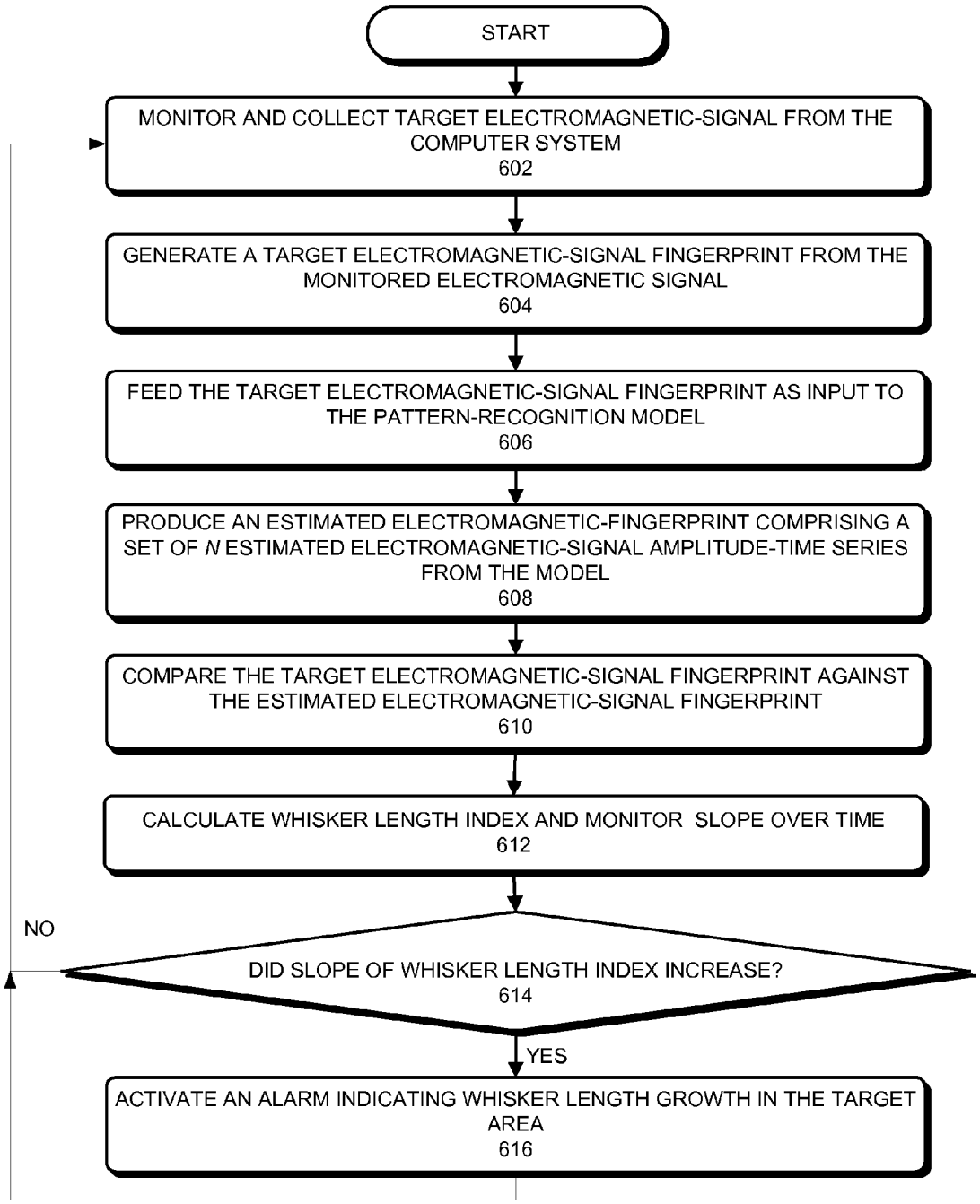
FIGS. 6A and 6B present flowcharts illustrating the process of monitoring an electromagnetic signal to detect whisker growth in a target area in accordance with some embodiments of the present invention.
Figure 6B:
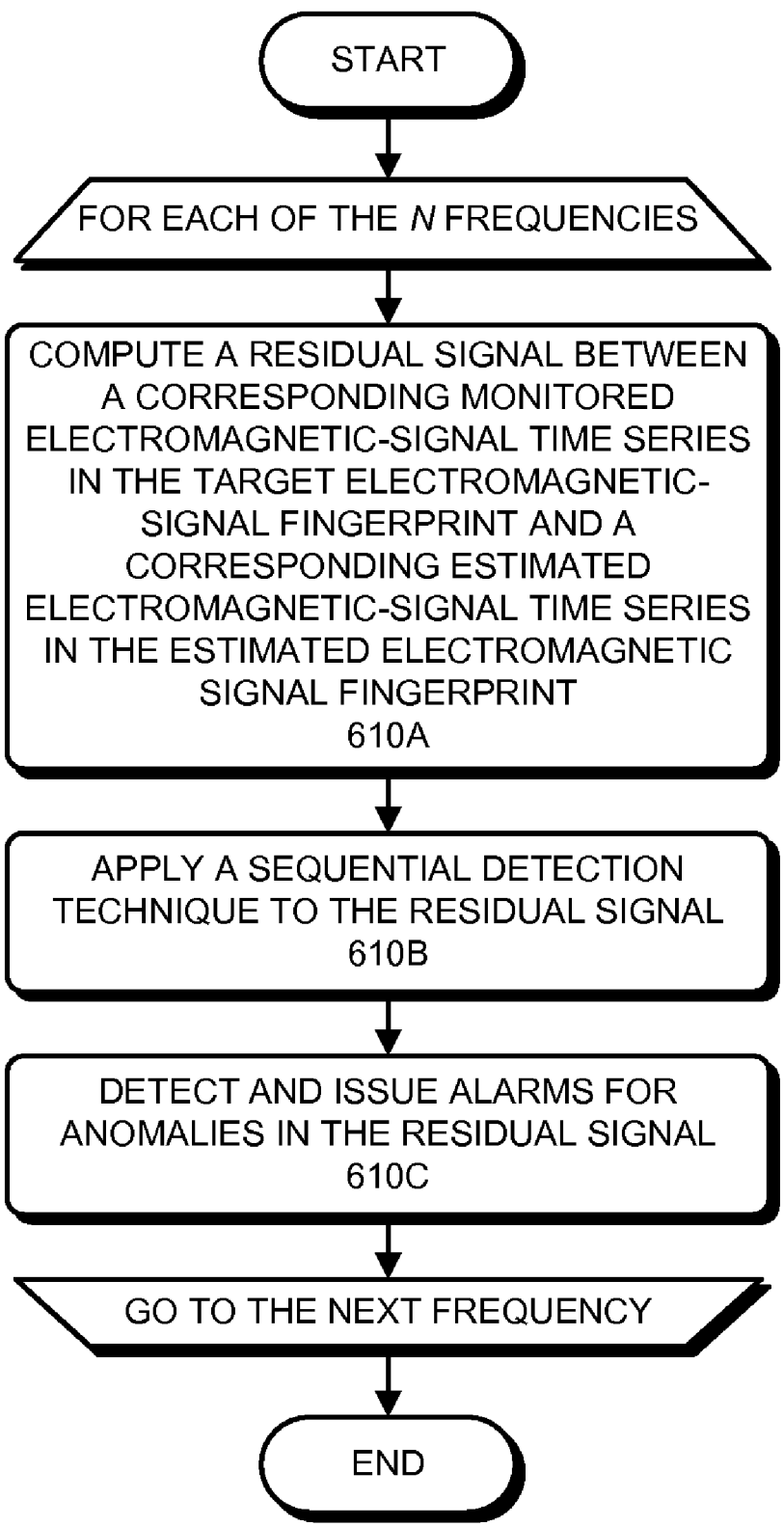

FIG. 6A presents a flowchart illustrating the process of monitoring an electromagnetic signal to determine a total whisker length for conductive whiskers in a computer system in accordance with an embodiment of the present invention.

During a monitoring operation, the system monitors and collects an electromagnetic signal from the target area in the computer system (step 602). In some embodiments of the present invention, the computer system is performing routine operations during the monitoring process; hence the computer system may be executing any workload during this process.

The system then generates a target electromagnetic-signal fingerprint from the monitored electromagnetic signal (step 604). Note that the target electromagnetic-signal fingerprint can be generated from the electromagnetic signal in a similar manner to generating the reference electromagnetic-signal fingerprint as described in conjunction with FIG. 3. In some embodiments of the present invention, the system generates the target electromagnetic signal fingerprint by: (1) transforming the monitored electromagnetic-signal time-series from the time-domain to the frequency-domain; (2) for each of the set of N frequencies in the reference electromagnetic-signal fingerprint, generating a monitored electromagnetic-signal amplitude-time series based on the frequency-domain representation of the monitored electromagnetic-signal collected over time; and (3) forming the target electromagnetic-signal fingerprint using the set of N monitored electromagnetic-signal amplitude-time series associated with the selected N frequencies. In some embodiments of the present invention, the target electromagnetic-signal fingerprint comprises all the N frequencies as the reference electromagnetic-signal fingerprint. In a further embodiment, the target electromagnetic-signal fingerprint comprises a subset of the N frequencies in the reference electromagnetic-signal fingerprint.

Next, the system feeds the target electromagnetic-signal fingerprint as input to the pattern-recognition model which has been trained using the reference electromagnetic-signal fingerprint (step 606), and subsequently produces an estimated electromagnetic-signal fingerprint as output (step 608). In some embodiments of the present invention, the estimated electromagnetic-signal fingerprint comprises a set of N estimated electromagnetic-signal amplitude-time series corresponding to the set of N monitored electromagnetic-signal amplitude-time series in the target electromagnetic-signal fingerprint.

The system then compares the target electromagnetic-signal fingerprint against the estimated electromagnetic-signal fingerprint (step 610). This step is shown in more detail in FIG. 6B. Specifically, for each of the selected N frequencies, the system computes a residual signal between a corresponding monitored electromagnetic-signal amplitude-time series in the target electromagnetic-signal fingerprint and a corresponding estimated electromagnetic-signal amplitude-time series in the estimated electromagnetic-signal fingerprint (step 610A). The system then applies a sequential detection technique to the residual signal (step 610B). In some embodiments of the present invention, the sequential detection technique is a Sequential Probability Ratio Test (SPRT). In some embodiments of the present invention, the SPRT uses the mean and variance computed for the corresponding residual signal during the model training process to detect anomalies in the residual signal, wherein the anomalies indicate a deviation of the monitored electromagnetic-signal amplitude-time series from the estimated electromagnetic-signal amplitude-time series. Note that when such anomalies are detected in the residual signal, SPRT alarms are subsequently issued (step 610C).

Referring back to FIG. 6A, the system next determines if anomalies are detected in at least one of the N monitored electromagnetic-signal amplitude-time series, for example, based on the SPRT alarms, and monitors the rate of the detection of SPRT alarms. The SPRT alarms are used to generate a whisker length index and the slope of the whisker length index is monitored over time (step 612). Next the system determines if the slope of the whisker length index has increased over time (step 614). If it has, the system activates an alarm indicating total whisker length growth in the target area (step 616) and then returns to step 602. Otherwise, the system returns directly to step 602.

Figure 7A:
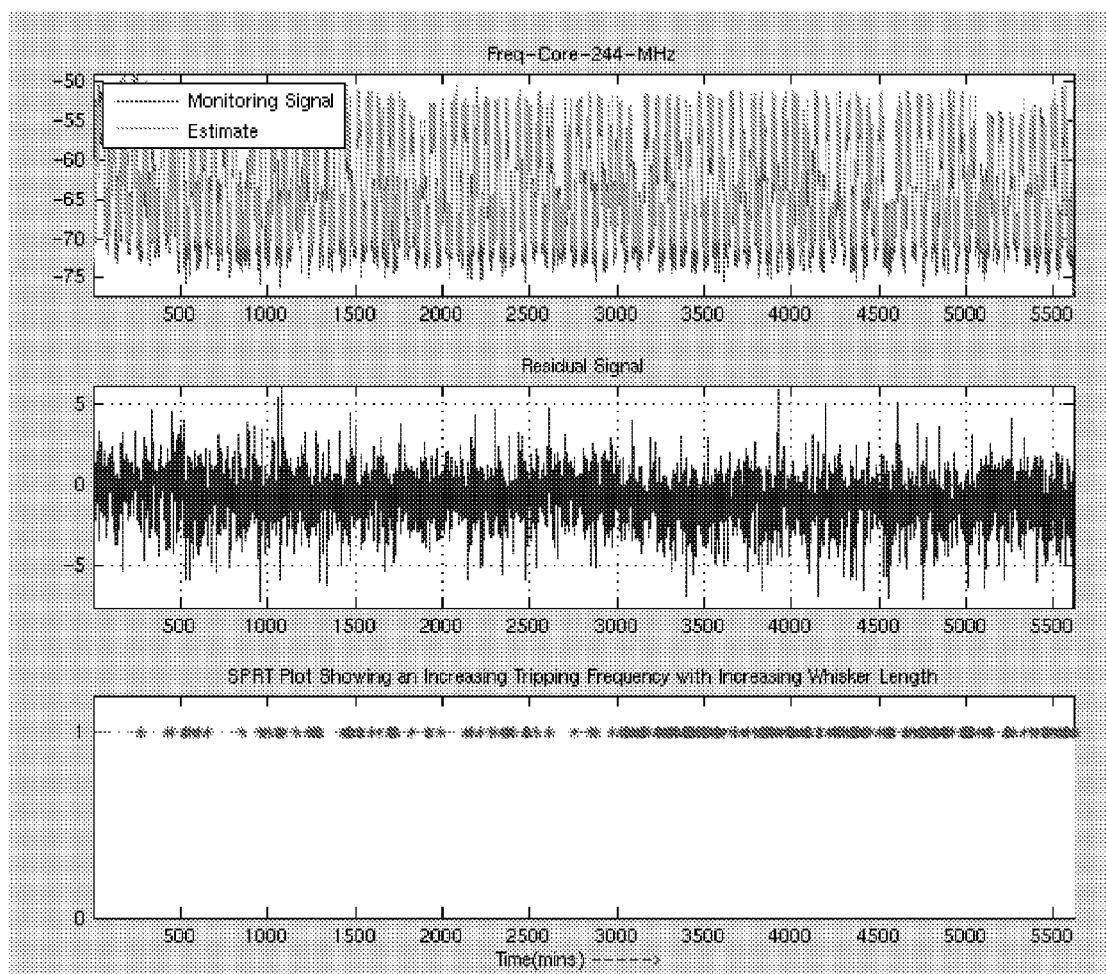
FIGS. 7A and 7B illustrate an example of determining a total whisker length for conductive whiskers on a circuit in a computer system by monitoring an individual electromagnetic-signal amplitude-time series using an NLNP regression model in accordance with some embodiments of the present invention.
Figure 7B:
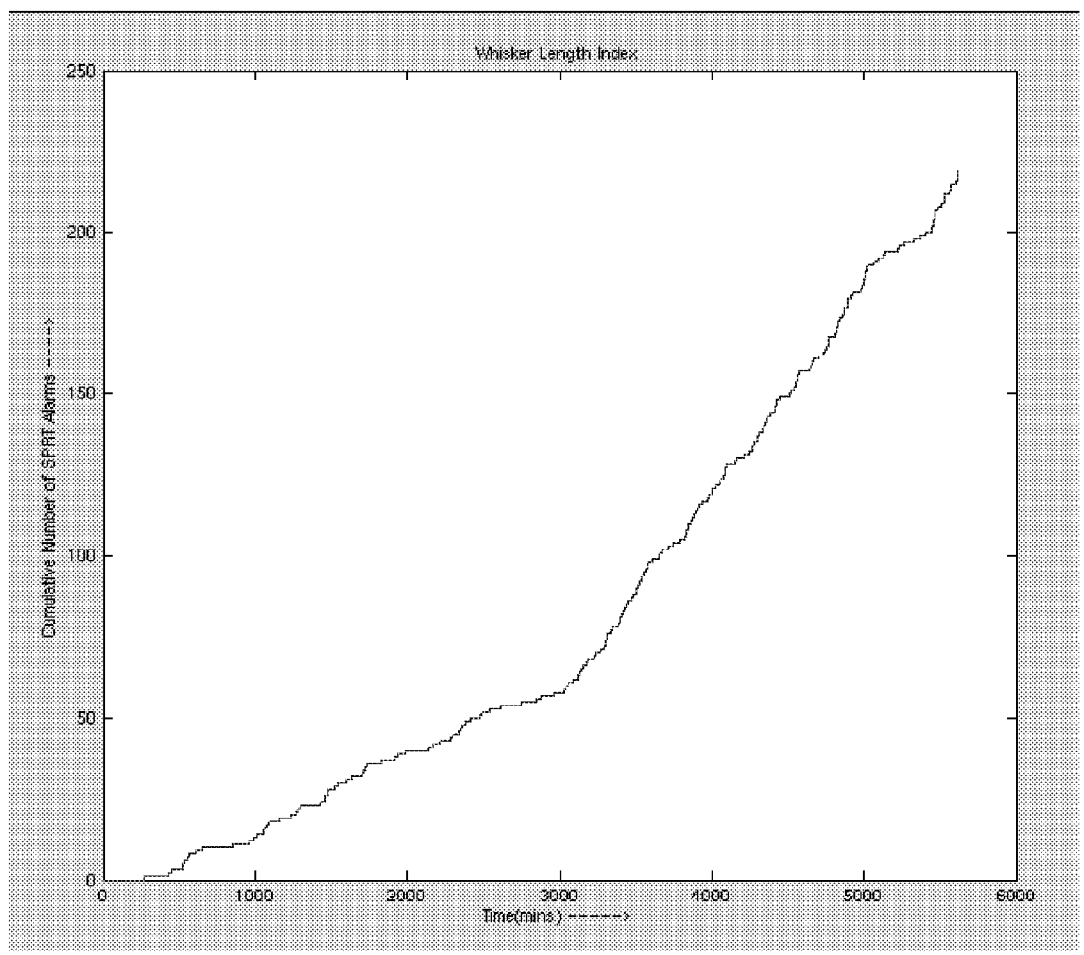

FIGS. 7A and 7B illustrate an example of determining a total whisker length for conductive whiskers in a computer system by monitoring individual electromagnetic-signal amplitude-time series using an NLNP regression model in accordance with some embodiments of the present invention. In the upper subplot of FIG. 7A, the red signal is the electromagnetic-signal time series being monitored, and the green signal is the NLNP regression model estimate (i.e., the signal that is estimated by the NLNP pattern-recognition model based on the learned correlations from the training data collected when the system was free of conductive whiskers).

At around time=501 minutes, a number of short conductive whiskers were added to the target area where the electromagnetic signal is being monitored. At around time=3001 minutes a number of long conductive whiskers were added to the target area where the electromagnetic signal is being monitored. Note that after the placement of the whiskers, the red and green signals diverge from each other as a result of the addition of the whiskers. The middle subplot in FIG. 7A illustrates the residual signal obtained by subtracting the NLNP estimates (green) from the corresponding monitored electromagnetic signal (red). The lower subplot in FIG. 7A shows alarms issued from SPRT, which signify a statistically significant divergence between the NLNP estimates and the monitored electromagnetic-signal time series. The rate of SPRT alarms increases when the short whiskers are added to the target area and then increases again when the long whiskers are added to the target area.

FIG. 7B shows a plot of the cumulative number of SPRT alarms over time. The graph shows a change in slope when the short whiskers are added to the target area at time=501 minutes. Another change in slope is seen at time=3001 minutes when the long whiskers are added to the target area.

In some embodiments of the invention, the slope of the cumulative number of SPRT alarms over time is measured for whiskers of known total length. The relationship between the slope of the cumulative number of SPRT alarms over time and whisker total length can then be used to determine the total length for conductive whiskers when the electromagnetic signal is monitored from the target area and SPRT alarms are generated in accordance with embodiments of the invention. In some embodiments, the relationship between the slope of the cumulative number of SPRT alarms over time and whisker total length is measured for the target area as whiskers of known lengths are added, while in other embodiments the whisker length in the target area is measured to determine the total whisker length, and the relationship is determined for other whisker lengths as the whiskers grow.

Note that embodiments of the present invention are equally applicable to tin whiskers, zinc whiskers, or any other type of conductive fiber-like contamination within electronic systems.

The foregoing descriptions of embodiments have been presented for purposes of illustration and description only. They are not intended to be exhaustive or to limit the present description to the forms disclosed. Accordingly, many modifications and variations will be apparent to practitioners skilled in the art. Additionally, the above disclosure is not intended to limit the present description. The scope of the present description is defined by the appended claims.

What is claimed is:

1. A method for determining a whisker length for conductive whiskers on a circuit in a computer system, comprising:
   monitoring a target electromagnetic signal radiating from the computer system; and
   analyzing the target electromagnetic signal to determine the whisker length for conductive whiskers on the circuit in the computer system, wherein a whisker comprises a fiber-like structure growing from at least one surface in the computer system.

2. The method of claim 1, wherein prior to monitoring the target electromagnetic signal, the method further comprises:
   monitoring a reference electromagnetic signal radiating from the computer system;
   generating a reference electromagnetic-signal fingerprint from the reference electromagnetic signal; and
   building a pattern-recognition model based on the reference electromagnetic-signal fingerprint.

3. The method of claim 2, wherein the pattern-recognition model includes a nonlinear, nonparametric regression model.

4. The method of claim 2, wherein analyzing the target electromagnetic signal includes:
   generating a target electromagnetic-signal fingerprint from the target electromagnetic signal;
   feeding the target electromagnetic-signal fingerprint into the pattern-recognition model;
   producing an estimated electromagnetic-signal fingerprint using the pattern-recognition model; and
   comparing the target electromagnetic-signal fingerprint to the estimated electromagnetic fingerprint to determine the whisker length, wherein the whisker length is related to a total whisker length.

5. The method of claim 4, wherein generating the reference electromagnetic-signal fingerprint includes:
   generating a frequency-domain representation of the reference electromagnetic signal;
   selecting a set of frequencies from the frequency-domain representation of the reference electromagnetic signal; and
   forming the reference electromagnetic-signal fingerprint using the set of frequencies.

6. The method of claim 5, wherein selecting the set of frequencies includes:
   dividing the frequency-domain representation of the reference electromagnetic signal into a plurality of frequencies;
   constructing a reference electromagnetic-signal amplitude-time series for each of the plurality of frequencies based on the reference electromagnetic signal collected over a predetermined time period;
   computing cross-correlations between pairs of reference electromagnetic-signal amplitude-time series associated with pairs of the plurality of frequencies;
   computing an average correlation coefficient for each of the plurality of frequencies; and
   selecting the set of frequencies based on the average correlation coefficients.

7. The method of claim 6, wherein building the pattern-recognition model based on the reference electromagnetic-signal fingerprint includes:
   training the pattern-recognition model using the reference electromagnetic-signal amplitude-time series associated with the set of frequencies as inputs to the pattern-recognition model.

8. The method of claim 5, wherein the reference electromagnetic signal is collected from the computer system while the computer system is executing a load script, wherein the load script includes a specified sequence of operations.

9. The method of claim 8, wherein the load script includes a dynamic load script.

10. The method of claim 5, wherein generating the target electromagnetic-signal fingerprint includes:
    transforming the target electromagnetic signal to a frequency-domain representation;
    for each frequency in the set of frequencies, generating a target electromagnetic-signal amplitude-time series based on the frequency-domain representation of the target electromagnetic signal collected over time; and
    forming the target electromagnetic-signal fingerprint using the target electromagnetic-signal amplitude-time series associated with the set of frequencies.

11. The method of claim 10, wherein comparing the target electromagnetic-signal fingerprint to the estimated electromagnetic fingerprint includes:
    for each frequency in the set of frequencies,
       computing a residual signal between a corresponding monitored electromagnetic-signal amplitude-time series in the target electromagnetic-signal fingerprint and a corresponding estimated electromagnetic-signal amplitude-time series in the estimated electromagnetic-signal fingerprint; and
    detecting anomalies in the residual signal by using sequential detection, wherein the anomalies indicate a deviation of the monitored electromagnetic-signal amplitude-time series from the estimated electromagnetic-signal amplitude-time series.

12. The method of claim 11, wherein determining the total whisker length includes monitoring a change in the detection of anomalies in one or more of the monitored electromagnetic-signal amplitude-time series over time.

13. The method of claim 11, wherein the sequential detection includes a sequential probability ratio test.

14. The method of claim 11, wherein determining the total whisker length includes measuring a rate of the detection of anomalies for a predetermined total whisker length.

15. The method of claim 2, wherein the whisker length is known when the reference electromagnetic signal is monitored.

16. The method of claim 1, further comprising:
monitoring a reference electromagnetic signal, wherein the whisker length is known when the reference electromagnetic signal is monitored; and
wherein analyzing the target electromagnetic signal to determine the whisker length includes comparing a derived target electromagnetic signal to a derived reference electromagnetic signal wherein the derived target electromagnetic signal is generated using information from the target electromagnetic signal and the derived reference electromagnetic signal is generated using information from the reference electromagnetic signal.

17. A computer-readable storage medium storing instructions that when executed by a computer cause the computer to perform a method for determining a total whisker length for conductive whiskers on a circuit in a computer system, the method comprising:
monitoring a target electromagnetic signal radiating from the computer system; and
analyzing the target electromagnetic signal to determine the total whisker length for conductive whiskers on the circuit in the computer system, wherein a whisker comprises a fiber-like structure growing from at least one surface in the computer system.

18. The computer-readable storage medium of claim 17, wherein prior to monitoring the target electromagnetic signal, the method further comprises:
monitoring a reference electromagnetic signal radiating from the computer system;
generating a reference electromagnetic-signal fingerprint from the reference electromagnetic signal; and
building a pattern-recognition model based on the reference electromagnetic-signal fingerprint.

19. An apparatus for determining a total whisker length for conductive whiskers on a circuit in a computer system, comprising:
a monitoring mechanism configured to monitor a target electromagnetic signal radiating from the computer system; and
an analyzing mechanism configured to analyze the target electromagnetic signal to determine the total whisker length for conductive whiskers on the circuit in the computer system, wherein a whisker comprises a fiber-like structure growing from at least one surface in the computer system.

20. The apparatus of claim 19, wherein:
the monitoring mechanism is further configured to monitor a reference electromagnetic signal, wherein the total whisker length is known when the reference electromagnetic signal is monitored; and
wherein the analyzing mechanism is further configured to analyze the target electromagnetic signal to determine the total whisker length by comparing a derived target electromagnetic signal to a derived reference electromagnetic signal wherein the derived target electromagnetic signal is generated using information from the target electromagnetic signal and the derived reference electromagnetic signal is generated using information from the reference electromagnetic signal.

* * * * *